United States Patent
Chiu

(10) Patent No.: US 11,706,565 B2
(45) Date of Patent: Jul. 18, 2023

(54) AUDIO SOURCE AMPLIFICATION WITH SPEAKER PROTECTION FEATURES AND INTERNAL VOLTAGE AND CURRENT SENSING

(71) Applicant: Meta Platforms Technologies, LLC, Menlo Park, CA (US)

(72) Inventor: Marshall Chiu, Santa Clara, CA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 0 days.

(21) Appl. No.: 17/369,920

(22) Filed: Jul. 7, 2021

(65) Prior Publication Data

US 2022/0272449 A1    Aug. 25, 2022

Related U.S. Application Data

(60) Provisional application No. 63/152,770, filed on Feb. 23, 2021.

(51) Int. Cl.
*H03F 3/187*    (2006.01)
*H04R 3/00*    (2006.01)
*H03G 3/30*    (2006.01)

(52) U.S. Cl.
CPC ............. *H04R 3/007* (2013.01); *H03F 3/187* (2013.01); *H03G 3/3005* (2013.01); *H03F 2200/03* (2013.01); *H03G 2201/103* (2013.01)

(58) Field of Classification Search
CPC ..... H04R 3/007; H03F 3/187; H03F 2200/03; H03G 3/3005; H03G 2201/103

(Continued)

(56) References Cited

U.S. PATENT DOCUMENTS 9,036,835 B2 *  5/2015  Buuck ................ H03F 3/217
                                                                                330/10
9,807,502 B1   10/2017  Hatab et al.
(Continued)

FOREIGN PATENT DOCUMENTS

EP        3697106 A1    8/2020
WO    WO2016189285 A1   12/2016

OTHER PUBLICATIONS

"MAX98360A: Tiny, Cost-Effective, Plug-and-Play Digital Class-D Amplifier," Maxim Integrated, retrieved from <<https://www.maximintegrated.com/en/products/analog/audio/MAX98360A.html>> on Feb. 17, 2021, 9 pages.

(Continued)

*Primary Examiner* — Vivian C Chin
*Assistant Examiner* — Friedrich Fahnert
(74) *Attorney, Agent, or Firm* — Lee & Hayes, P.C.

(57) ABSTRACT

An apparatus for amplifying an audio source includes a speaker and a chip. The chip includes a processor configured to generate a signal and an amplifier element configured to amplify the signal into an amplified signal. The chip further includes a current monitor configured to monitor the current of the amplified signal prior to the amplified signal being output from the chip to the speaker and a voltage monitor configured to monitor the voltage of the amplified signal prior to the amplified signal being output from the chip to the speaker. The processor of the chip is configured to control a power of the amplified signal output from the chip to the speaker based at least on the current and the voltage.

20 Claims, 6 Drawing Sheets

(58) Field of Classification Search
USPC .......................................................... 381/55
See application file for complete search history.

(56) References Cited

U.S. PATENT DOCUMENTS

| | | | | |
|---|---|---|---|---|
| 2004/0178852 | A1* | 9/2004 | Neunaber | H03G 11/04 |
| | | | | 330/284 |
| 2007/0154021 | A1* | 7/2007 | Bohman | H04R 3/08 |
| | | | | 381/59 |
| 2017/0347188 | A1* | 11/2017 | Thyssen | H04R 3/007 |
| 2018/0324524 | A1* | 11/2018 | Hezar | H03F 3/187 |
| 2022/0047219 | A1* | 2/2022 | Weiss | A61B 5/055 |

OTHER PUBLICATIONS

"MAX98390: Boosted Class-D Amplifier with Integrated Dynamic Speaker Management," Maxim Integrated, retrieved from <<https://www.maximintegrated.com/en/products/analog/audio/MAX98390.html>> on Feb. 17, 2021, 9 pages.

International Search Report and Written Opinion for International Application No. PCT/US2022/017494, dated May 30, 2022, 10 pages.

* cited by examiner

AUDIO SOURCE AMPLIFICATION WITH SPEAKER PROTECTION FEATURES AND INTERNAL VOLTAGE AND CURRENT SENSING

This application claims the benefit of priority to U.S. Provisional Application No. 63/152,770, filed Feb. 23, 2021, which is incorporated herein by reference.

BACKGROUND

Conventional speaker amplifiers with speaker protection features may include external sensing pins that are used to sense the current and the voltage at a speaker terminal for the purpose of pushing the speaker to its maximum capabilities without damaging the speaker. However, conventional speaker amplifiers that include such speaker protection features are more technically complicated and expensive than speaker amplifiers without the current and voltage sensing feature—due at least in part to the cost related to the external sensing pins needed to provide the current and voltage sensing capabilities.

SUMMARY

An apparatus for amplifying an audio source is described herein. The apparatus includes a smart amplifier circuit which may be implemented as a system-on-a-chip (SOC) to drive one or more speakers. The SOC or "chip" of the apparatus may include a processor configured to generate a signal (e.g., an audio signal) and one or more amplifier elements configured to amplify the signal into an amplified signal. The chip of the apparatus further includes a current monitor configured to monitor the current of the amplified signal prior to the amplified signal being output from the chip to the one or more speakers, and a voltage monitor configured to monitor the voltage of the amplified signal prior to the amplified signal being output from the chip to the one or more speakers. The current and voltage measurements may be used to determine a speaker voice coil temperature and/or a speaker diaphragm excursion. Based at least on the current and the voltage, the processor of the chip is configured to control the power of the amplified signal output from the chip to the one or more speakers to avoid overtemperature and/or over-excursion conditions which can damage the speaker. Accordingly, the apparatus may use the described techniques to sense the current and the voltage of the amplified signal without a need for external sensing pins. By sensing the current and the voltage of the amplified signal prior to the amplified signal being output from the chip to the one or more speakers, the techniques described herein enable the apparatus to amplify the audio source without damaging the one or more speakers, reduces a pin count of the chip, and brings down the manufacturing cost of the apparatus.

In some examples, the apparatus may include a head mounted device and the smart amplifier circuit may be located on an exterior surface of the head mounted device, on an interior surface of the head mounted device, in a cavity or housing of the head mounted device, etc. The smart amplifier circuit may be disposed near the one or more speakers. For example, the smart amplifier circuit may be directly connected to speaker terminals of the one or more speakers or within a short distance from the one or more speakers to avoid extra resistance caused by traces or wires connecting the smart amplifier circuit to the one or more speakers.

In some examples, a method for amplifying an audio source is disclosed. The method includes generating a signal and amplifying the signal into an amplified signal. The method further includes determining a voltage of the amplified signal prior to the amplified signal being output from a chip to one or more speakers and determining a current of the amplified signal prior to the amplified signal being output from the chip to the one or more speakers. The method also includes controlling the power of the amplified signal output from the chip to the one or more speakers based at least on the current and the voltage.

In some examples, one or more non-transitory computer-readable media configured to amplify an audio source is disclosed. The one or more non-transitory computer-readable media storing instructions that, when executed by one or more processors, cause the one or more processors to perform operations. The operations include generating a signal and amplifying the signal into an amplified signal. In some examples, the operations further include determining a voltage of the amplified signal prior to the amplified signal being output from a chip to one or more speakers and determining a current of the amplified signal prior to the amplified signal being output from the chip to the one or more speakers. In some examples, the operations also include controlling a power of the amplified signal output from the chip to the one or more speakers based at least on the current and the voltage.

Figure 1:
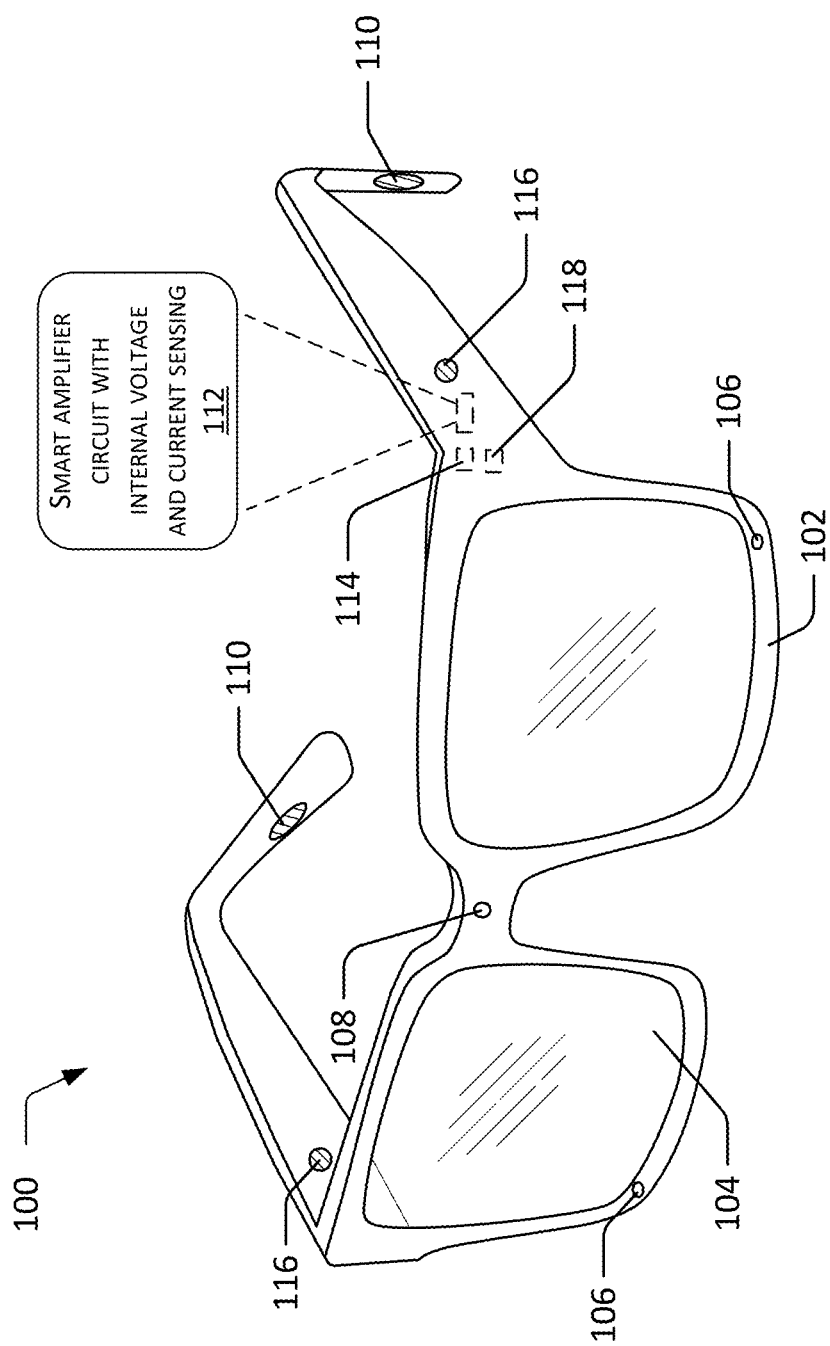
FIG. 1 is a perspective view of an example apparatus, implemented as an eyewear device, configured to amplify an audio source, in accordance with one or more examples.

The figures depict various examples for purposes of illustration only. One skilled in the art will readily recognize from the following discussion that alternative examples of the structures and methods illustrated herein may be employed without departing from the principles described herein.

DETAILED DESCRIPTION

Conventional speaker amplifiers with speaker protection features (so called "smart amplifiers") may monitor the current and the voltage of an amplified signal at a speaker terminal for the purpose of pushing the speaker to its maximum capabilities without damaging the speaker. However, conventional speaker amplifiers that include such speaker protection features require external sensing pins to provide sensing capability. These external sensing pins increase the complexity of the smart amplifier which creates an additional failure point and increases the cost of the smart amplifier. Accordingly, this disclosure describes an apparatus that amplifies an audio source and includes current and voltage sensing to provide speaker protection without external sensing pins. The techniques described herein can increase a reliability and/or reduce a cost of the amplifier apparatus relative to conventional smart amplifiers.

An apparatus for amplifying an audio source is described herein. The apparatus amplifies the audio source by sensing the current and the voltage of an amplified signal prior to the amplified signal being output from a chip to one or more speakers. In some examples, an amplification system of the apparatus may use the current and the voltage of the amplified signal to determine an expected resistance. Based on the expected resistance and a temperature coefficient of resistance of the one or more speakers, the amplification system may determine an expected temperature based on the expected resistance and the temperature coefficient of resistance, and control the power from the chip to the speaker based at least in part on the expected temperature being less than a temperature limit of the one or more speakers. Additionally or alternatively, in some examples, the amplification system may use the current and the voltage of the amplified signal to determine an expected excursion, and control the power from the chip to the one or more speakers based at least in part on the expected excursion being less than an excursion limit of the one or more speakers.

In some examples, an amplifier circuit of the amplification system (e.g., an amplifier circuit on the chip) may be located proximate to the one or more speakers. Placing the amplifier circuit close to the one or more speakers reduces and minimizes resistance caused by traces or wires connecting the amplifier circuit to the one or more speakers, thereby improves the measurement accuracy of the current and the voltage of the amplified signal.

Accordingly, techniques such as monitoring the current and the voltage of an amplified signal to provide speaker protection can be employed without external sensing pins. By monitoring the current and the voltage of the amplified signal prior to the amplified signal being output from a chip to one or more speakers, the techniques described herein enable an apparatus to push a speaker to its maximum capabilities without damaging the speaker, reduces pin count of the chip, and brings down the manufacturing cost of the apparatus. The apparatus described herein includes electronic devices that output sounds (e.g., via one or more speakers). Examples of apparatuses include, but are not limited to, wearable devices (e.g., glasses, headsets, helmets, hearing aids, etc.), mobile devices (e.g., phones, tablets, etc.), video game systems or controllers, vehicles, or other portable or stationary electronic devices.

Examples of the present disclosure may include or be implemented in conjunction with an extended reality system. Extended reality is a form of reality that has been adjusted in some manner before presentation to a user, which may include, e.g., a virtual reality (VR), an augmented reality (AR), a mixed reality (MR), a hybrid reality, or some combination and/or derivatives thereof. Extended reality content may include completely generated content or generated content combined with captured (e.g., real-world) content. The extended reality content may include video, audio, haptic feedback, or some combination thereof, and any of which may be presented in a single channel or in multiple channels (such as stereo video that produces a three-dimensional effect to the viewer). Additionally, in some examples, extended reality may also be associated with applications, products, accessories, services, or some combination thereof, that are used to, e.g., create content in an extended reality and/or are otherwise used in (e.g., to perform activities in) an extended reality environment. The extended reality system that provides the extended reality content may be implemented on various platforms, including a headset (e.g., head-mounted display (HMD) and/or near-eye display (NED)) connected to a host computer system, a standalone headset, a mobile device or electronic device or system, or any other hardware platform capable of providing extended reality content to one or more viewers.

FIG. 1 is a perspective view of a headset 100, implemented as an eyewear device, configured to amplify an audio source in accordance with the techniques described herein. In some examples, the eyewear device is a near eye display (NED). In general, the headset 100 may be worn on the face of a user such that content (e.g., media content) is presented using a display assembly and/or an amplification system. Examples are also considered in which the headset 100 presents media content to a user in a different manner. Examples of media content presented by the headset 100 include one or more images, video, audio, or some combination thereof. The headset 100 includes a frame 102, and may include, among other components, a display assembly including one or more display elements 104, a depth camera assembly (DCA), and an amplification system. While FIG. 1 illustrates the components of the headset 100 in example locations on the headset 100, the components may be located elsewhere on the headset 100, on a peripheral device paired with the headset 100, or some combination thereof. Similarly, there may be more or fewer components on the headset 100 than what is shown in FIG. 1.

The frame 102 may hold the other components of the headset 100. In some examples, the frame 102 includes a front portion that holds the one or more display elements 104, and end pieces (e.g., temples) to attach the headset 100 to a head of the user. In some cases, the front portion of the frame 102 bridges the top of a nose of the user. The length of the end pieces may be adjustable (e.g., adjustable temple length) to fit different users. The end pieces may also include a portion that curls behind the ear of the user (e.g., temple tip, ear piece, etc.).

The one or more display elements 104 may emit light visible to a user wearing the headset 100. As illustrated, the headset 100 includes a display element 104 for each eye of a user, although other configurations of the display elements are also considered. In some examples, a display element 104 generates image light that is provided to an eyebox of the headset 100. The eyebox may correspond to a location in space that an eye of user occupies while wearing the headset 100. For example, a display element 104 may be a waveguide display. A waveguide display includes a light source (e.g., a two-dimensional source, one or more line sources, one or more point sources, etc.) and one or more waveguides. Light from the light source is in-coupled into the one or more waveguides which outputs the light in a manner such that there is pupil replication in an eyebox of the headset 100. In some examples, the display elements 104 may use one or more diffraction gratings to perform in-coupling and/or outcoupling of light from the one or more waveguides. In some examples, the waveguide display includes a scanning element (e.g., waveguide, mirror, etc.) that scans light from the light source as the light is in-coupled into the one or more waveguides. In some cases, one or both of the display elements 104 are opaque and do not transmit light from a local area or environment around the headset 100 through the display elements 104 to the eyebox. For example, the local area may be a room that a user wearing the headset 100 is inside, or the user wearing the headset 100 may be outside and the local area is an outside area. In cases in which the display elements 104 are opaque, the headset 100 may generate VR content to be viewed via the display elements 104. Examples are also considered in which one or both of the display elements 104 are at least partially transparent, such that light from the local area may be combined with light from the one or more display elements 104 to produce AR and/or MR content.

In some examples, a display element 104 is a lens that transmits light from the local area to the eyebox. For instance, one or both of the display elements 104 may be a lens without correction (non-prescription) or a prescription lens (e.g., single vision, bifocal and trifocal, or progressive) to help correct for defects in a user's eyesight. In some examples, the display element 104 may be polarized and/or tinted to protect the user's eyes from the sun.

In some examples, the display element 104 may include an optics block (not shown). The optics block may include one or more optical elements (e.g., lens, Fresnel lens, etc.) that direct light from the display element 104 to the eyebox. The optics block may, in some cases, correct for aberrations in some or all of the image content, magnify some or all of the image, or some combination thereof.

The DCA may determine depth information for a portion of a local area surrounding the headset 100. In some examples, the DCA includes one or more imaging devices 106, a DCA controller (not shown in FIG. 1), and an illuminator 108. In some examples, the illuminator 108 illuminates a portion of the local area with light. The light may be, for instance, structured light (e.g., dot pattern, bars, etc.) in the infrared (IR), IR flash for time-of-flight, and so forth. In some examples, the one or more imaging devices 106 capture images of the portion of the local area that include the light from the illuminator 108. The example headset 100 includes a single illuminator 108 and two imaging devices 106, but alternate configurations including differing numbers of illuminators and/or imaging devices are also considered.

The DCA controller may compute depth information for at least a portion of the local area using captured images and one or more depth determination techniques. The DCA controller may utilize depth determination techniques such as, but not limited to, direct time-of-flight (ToF) depth sensing, indirect ToF depth sensing, structured light, passive stereo analysis, active stereo analysis (e.g., using texture added to the scene by light from the illuminator 108), other technique(s) to determine the depth of a scene, or some combination thereof. In some examples, the headset 100 may perform simultaneous localization and mapping (SLAM) for a position of the headset 100 and updating of a model of the local area. For example, the headset 100 may include a passive camera assembly (PCA) that generates color image data. The PCA may include one or more RGB cameras that capture images of some or all of the local area. In some examples, some or all of the imaging devices 106 of the DCA may also function as the PCA. The images captured by the PCA and the depth information determined by the DCA may be used by the headset 100 to determine parameters of the local area, generate a model of the local area, update a model of the local area, or some combination thereof. In some examples, the headset 100 may include one or more sensor arrays 110 that generate measurement signals in response to the motion of the headset 100 and tracks the position (e.g., location and pose) of the headset 100 within the room. The sensor array(s) 110 may include, for example, an optical displacement sensor, an inertial measurement unit, an accelerometer, a gyroscope, or another suitable type of sensor that detects motion, or some combination thereof.

In some examples, the headset 100 includes an amplification system (described in more detail in relation to FIGS. 3 and 4) that includes a smart amplifier or amplifier circuit 112, a controller 114, and one or more speakers 116. The amplifier circuit 112 may be configured to receive an audio signal, perform signal processing on the audio signal, and amplify the processed audio signal to generate one or more amplified signals. The amplifier circuit 112 may further be configured to monitor the current and the voltage of the one or more amplified signals prior to and/or while the one or more amplified signals are output from the amplifier circuit 112 to the one or more speakers 116. Based on the monitored current and the voltage of the one or more amplified signals, the controller 114 may be configured to control a power of the one or more amplified signals output from the amplifier circuit 112 to the one or more speakers 116 to avoid damage to the speaker(s) 116. In some examples, each of the speaker(s) 116 uses a diaphragm that is driven via a voice coil to generate sound based on the amplified signals. The example headset 100 includes an example speaker arrangement with two speakers 116A and 116B. However, it is contemplated that the headset 100 may include one, three, four, or more speakers 116, and thus, the headset 100 may be configured to provide audio output from one or more directions. In some examples, the one or more speakers 116 may be located on an exterior surface of the headset 100, on an interior surface of the headset 100, in a cavity or housing of the headset 100, or a combination thereof. The number and/or locations of the one or more speakers 116 may be different from what is shown in FIG. 1. For example, the one or more speakers 116 may be located in the front portion of the headset 100. As another example, the one or more speakers 116 may be located at the front, back, and/or side portion of the headset 100 to provide stereo sound, surround sound, or other multi-channel audio experiences. A sufficiently large trace or wire may be used to connect the one or more speakers 116 and the amplifier circuit 112 to minimize the resistance from the trace or the wire. The amplification system is not limited to the amplifier circuit 112, the controller 114, and/or the one or more speakers 116 described, and in some cases, may include different and/or additional components. For example, the one or more speakers 116 may be located remotely from the amplifier circuit 112, and the amplification system may further include a resistance compensation module 118 configured to compensate for the resistance from a trace or a wire that connects the one or more speakers 116 and the amplifier circuit 112. For instance, the resistance compensation module 118 may be implemented in software and/or hardware and may include a lookup table, function, algorithm, circuit, or other component to determine an actual current and/or voltage applied to the one or more speakers based on the current and/or voltage output from the amplifier circuit. Additionally, in some examples, functionality described with reference to the components of the amplification system can be distributed among various components differently than as described in relation to FIG. 1.

In some examples, the controller 114 may determine an expected speaker voice coil temperature based on the current and the voltage of the amplified signals monitored by the amplifier circuit 112. Overtemperature meltdown is one of the main causes of permanent speaker damage. Based on the current and the voltage of the amplified signal prior to the amplified signals being output from the amplifier circuit 112 to the speakers 116, the controller 114 may determine an expected resistance of the speaker voice coil using Ohm's law. The controller 114 may further determine an expected speaker voice coil temperature based on the expected resistance of the speaker voice coil and a temperature coefficient of resistance of the speaker voice coil. The controller 114 may control the power from the amplifier circuit 112 to the speakers 116 based at least in part on the expected speaker voice coil temperature being less than a temperature limit of the speaker voice coil of the speakers 116.

In some examples, the controller 114 may generate an adjusted signal at least in part on the expected speaker voice coil temperature being equal to or greater than the temperature limit of the speaker voice coil of the speakers 116. The amplifier circuit 112 may receive the adjusted signal and amplify the adjusted signal to obtain an amplified-adjusted signal. The controller 114 may further control the power from the amplifier circuit 112 to the speakers 116 to output the amplified-adjusted signal from the amplifier circuit 112 to the speakers 116.

Additionally or alternatively, in some examples, the controller 114 may determine an expected diaphragm excursion based on the current and the voltage of the amplified signal sensed by the amplifier circuit 112. Speaker diaphragm excursion is another main cause of permanent speaker damage. Based on the current and the voltage of the one or more amplified signals prior to the one or more amplified signals being output from the amplifier circuit 112 to the one or more speakers 116, the controller 114 may determine an expected diaphragm excursion using a lookup table. In some examples, the lookup table may be generated by measuring the excursion of the speaker diaphragm using a laser displacement device and mapping the measured excursion to the voltage applied to the speaker terminals of speakers 116. The controller 114 may control the power from the amplifier circuit 112 to the one or more speakers 116 based at least in part on the expected diaphragm excursion being less than an excursion limit of the speakers 116.

In some examples, the controller 114 may generate an adjusted signal at least in part on the expected diaphragm excursion being equal to or greater than the excursion limit of the speakers 116. The amplifier circuit 112 may receive the adjusted signal and amplify the adjusted signal to obtain an amplified-adjusted signal. The controller 114 may further control the power from the amplifier circuit 112 to the speakers 116 to output the amplified-adjusted signal from the amplifier circuit 112 to the speakers 116.

Accordingly, the amplifier circuit 112 includes the current and voltage sensing capabilities that are performed internal to the amplifier circuit 112. By monitoring the current and the voltage of the amplified signal internally, the amplifier circuit 112 eliminates the need for external sensing pins required by conventional speaker amplifiers. These external sensing pins increase the complexity of the conventional speaker amplifier which creates additional failure points. By eliminating the external sensing pins, the amplifier circuit 112 reduces failure points and therefore improves reliability compare to conventional speaker amplifiers. Moreover, the amplifier circuit 112 can be implemented for the same or similar prices as a regular amplifier circuit which does not have the current and voltage sensing capability. The cost for amplifier circuits is directly proportional to the die size and the die size is proportional to the pin count. For most of these amplifier circuits, the pin count is what dictates the die size and thus the cost. Lowering the pin count will in turn reduce the cost. By monitoring the current and the voltage of the amplified signal prior to the amplified signal being output from the amplifier circuit 112 to speakers 116, the amplifier circuit 112 enables the headset 100 to push the speakers 116 to its maximum capabilities without damaging the speakers 116, reduces pin count of the amplifier circuit 112, and brings down the manufacturing cost of the headset 100.

Figure 2:
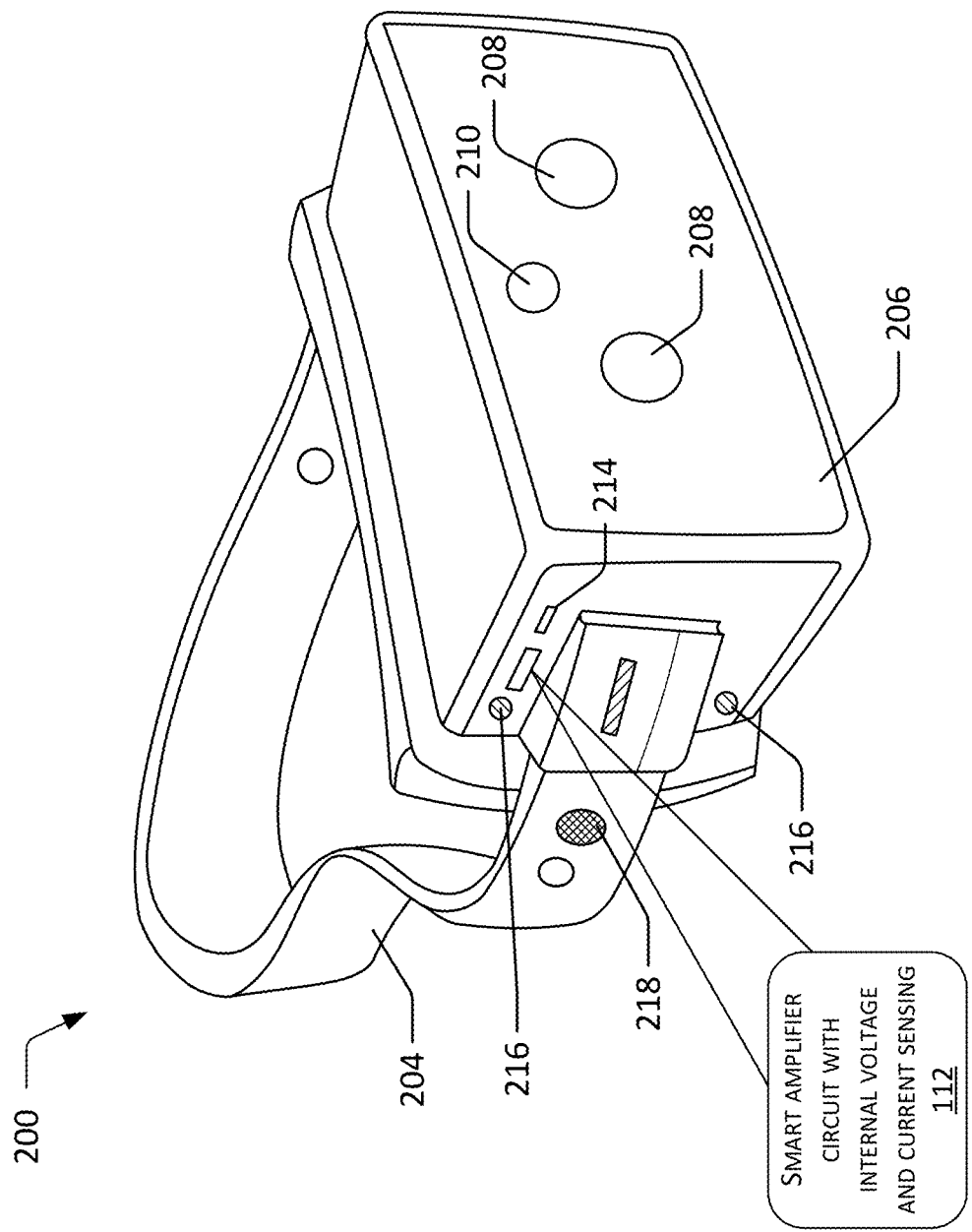
FIG. 2 is a perspective view of an example apparatus, implemented as a head-mounted display (HMD), configured to amplify an audio source, in accordance with one or more examples.

FIG. 2 is a perspective view of a headset, implemented as a head-mounted display (HMD) 200, including a smart amplifier circuit configured to amplify an audio source, in accordance with one or more examples. In some examples, portions of a front side of the HMD 200 are at least partially transparent in the visible band (e.g., 380 nm to 750 nm), and portions of the HMD 200 that are between the front side of the HMD 200 and an eye of the user are at least partially transparent (e.g., a partially transparent electronic display). The HMD 200 includes a front rigid body 202 and a strap or band 204. In some examples, the HMD 200 includes some or all of the same components described above with reference to FIG. 1, which may be modified to integrate with the form factor of the HMD 200. For example, the HMD 200 may include a display assembly 206, a DCA, and an amplification system. Additionally, in some examples, the HMD 200 includes one or more cameras or other imaging devices 208 to capture images of an environment surrounding the HMD 200, an illuminator 210 for illuminating at least a portion of the environment surrounding the HMD 200, an amplifier circuit 212, a controller 214, one or more speakers 216, and one or more other sensors 218 (e.g., optical displacement sensors, inertial measurement units, accelerometers, gyroscopes, or other sensors to detect motion or other conditions or associated with the HMD 200). Different components may be located in various locations, such as coupled to the band 204, coupled to the front rigid body 202, or may be configured to be inserted within the ear canal of a user, to name a few examples.

Figure 3A:
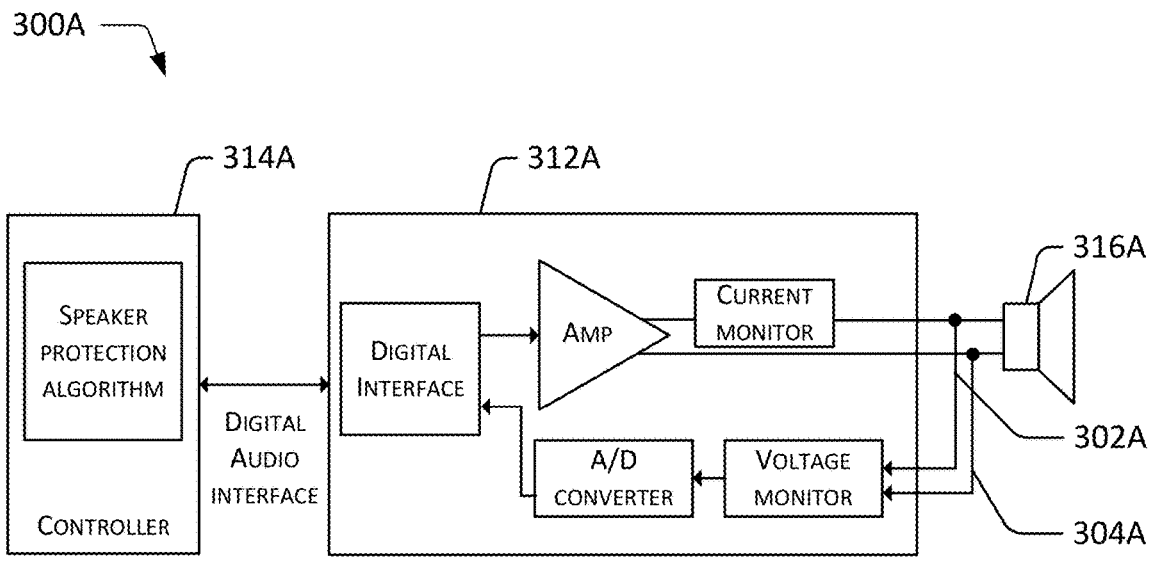
FIG. 3A is a block diagram illustrating an example amplification system with external sensing pins.
Figure 3B:
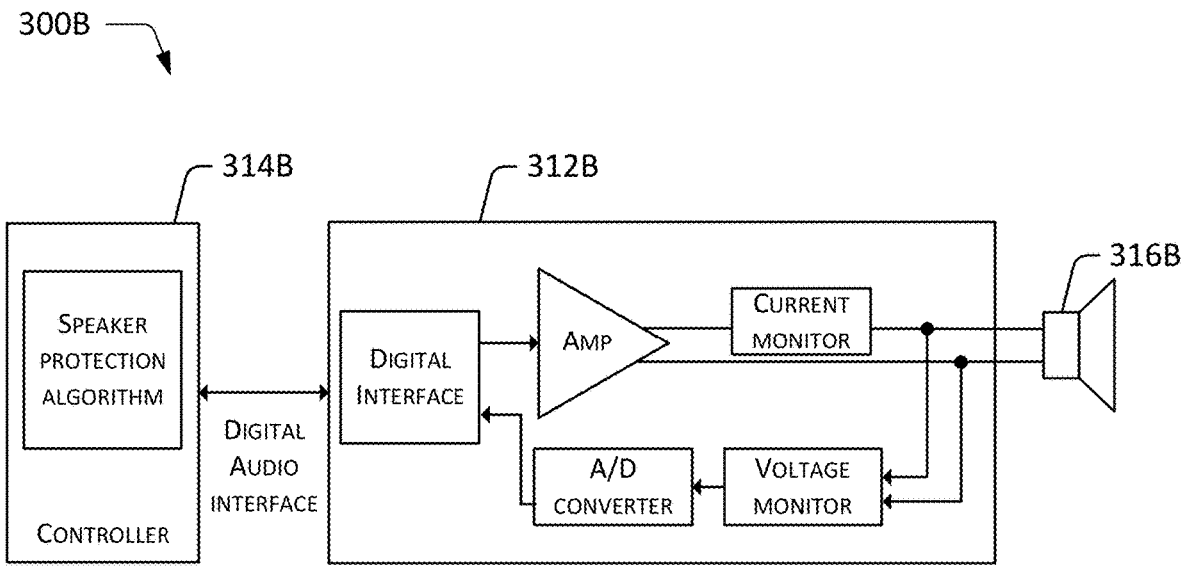
FIG. 3B is a block diagram illustrating an example amplification system with without external sensing pins.

FIGS. 3A and 3B are block diagrams illustrating a structure of an example amplification system with external sensing pins and a structure of an example amplification system with internal voltage and current sensing and without external sensing pins, respectively. For example, FIG. 3A is a block diagram of an example amplification system 300A with external sensing pins 302A and 304A. The example amplification system 300A includes an amplifier circuit 312A, a controller 314A, and a speaker 316A. The amplifier circuit 312A may be configured to receive an audio signal, perform signal processing on the audio signal, and amplify the processed audio signal to generate an amplified signal to drive speaker 316A. As shown in FIG. 3A, the amplifier circuit 312A of the example amplification system 300A includes the external sensing pins 302A and 304A that measure the current and the voltage of an amplified signal directly at the terminals of speaker 316A. Based on the current and the voltage sensed, the controller 314A may use a speaker protection algorithm to control the power from the amplifier circuit 312A to the speakers 316A to output the amplified signal. The external sensing pins 302A and 304A increase the die size of the amplifier circuit 312A, and therefore, cause an increase in the manufacturing cost of the example amplification system 300A relative to the example amplification system of FIG. 3B.

FIG. 3B is a block diagram of an example amplification system 300B without external sensing pins, in accordance with one or more examples. The amplification system 300B may be implemented in an electronic device, such as the headset 100 of FIG. 1 and/or the HMD 200 of FIG. 2, although other types of electronic devices may implement the amplification system as well, such as hearing aids, mobile devices, tablets, vehicles, and so on. Similar to the example amplification system 300A, amplification system 300B includes an amplifier circuit 312B, a controller 314B, and a speaker 316B. The amplifier circuit 312B may include a digital interface, an analog-to-digital (AD) converter, a voltage monitor, a current monitor, and an amplifier. The digital interface may receive an audio signal input (e.g., a digital audio signal) and perform signal processing on the audio signal input. For example, the digital interface may apply one or more digital filters to increase audio quality, perform noise canceling, enhance or suppress certain frequencies, etc. The filtered digital signal produced by the digital interface may be converted to an analog signal using the AD converter. The analog signal may be amplified using the amplifier to generate an amplified signal. The voltage monitor and the current monitor located on the amplifier circuit 312B may be used to monitor the current and the voltage of the amplified signals prior to the one or more amplified signal being output from the amplifier circuit 312B to the speaker 316B. As shown in FIG. 3B, the amplifier circuit 312B is located proximate the terminals of the speaker 316B, thereby eliminating the external sensing pins 302A and 304A required in the example amplification system 300A. In some examples, the amplifier circuit 312B may be located in direct contact with the terminals of the speaker 316B, while in some examples the amplifier circuit 312B may be located away from the terminals of the speaker 316B and a resistance compensation module may be used to compensate for the resistance from a trace or a wire that connects the speaker 316B and the amplifier circuit 312B. The resistance compensation module may be implemented in software and/or hardware and may include a lookup table, function, algorithm, circuit, or other component to determine an actual current and/or voltage applied to the one or more speakers based on the current and/or voltage output from the amplifier circuit. In some examples, the resistance compensation module may be built into the speaker protection algorithm or another software and/or hardware component of the controller 314B. By sensing the current and the voltage of the amplified signal prior to the amplified signal being output from the amplifier circuit 312B to the speaker 316B, the techniques described herein enables the amplification system 300B to amplify the audio source without damaging the speaker 316B, reduces pin count of the amplifier circuit 312B, increases the reliability of the amplifier circuit 312B, and brings down the manufacturing cost of the amplification system 300B.

Figure 4:
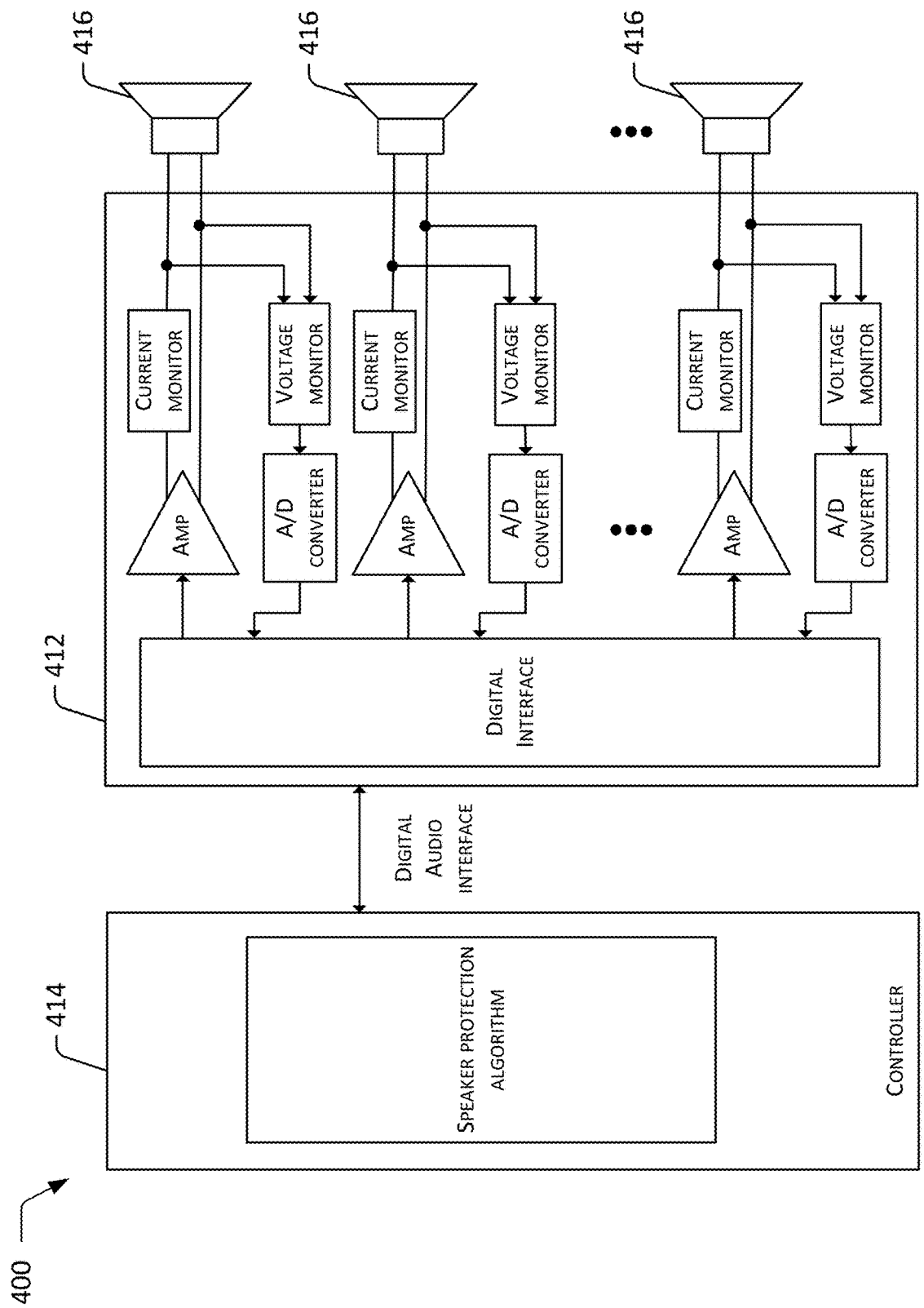
FIG. 4 is a structure of an example amplification system having two or more speakers, in accordance with one or more examples.

FIG. 4 is a block diagram illustrating a structure of an example amplification system 400 having two or more speakers 416, in accordance with one or more examples. The amplification system 400 may be implemented in an electronic device, such as the headset 100 of FIG. 1 and/or the HMD 200 of FIG. 2, although other types of electronic devices may implement the amplification system as well, such as hearing aids, mobile devices, tablets, vehicles, and so on. Similar to the amplification system 300B, amplification system 400 includes an amplifier circuit 412 and a controller 414. The amplification system 400 may further include two or more speakers 416. The amplifier circuit 412 may include a digital interface, an AD converter, a voltage monitor, a current monitor, and two or more amplifiers. The amplifier circuit 412 may be configured to receive an audio signal, perform signal processing on the audio signal, and amplify the processed audio signal to generate two or more amplified signals to drive the two or more speakers 416, which can be used to provide stereo sound, surround sound, or other multi-channel audio experiences. In some examples, the speakers 416 can be disposed in an array.

While the speakers in this example are all shown being proximate to the chip 412, in other examples the two or more speakers 416 may be located away from the chip 412 (e.g., located proximate to the temples of a user) and the resistance caused by a trace or a wire connecting the chip 412 and the two or more speakers 416 may be compensated using software compensation. For instance, as discussed above, the resistance compensation module may be implemented in software and/or hardware and may include a lookup table, function, algorithm, circuit, or other component to determine an actual current and/or voltage applied to the one or more speakers based on the current and/or voltage output from the amplifier circuit. In some examples, the resistance compensation module may be built into the speaker protection algorithm or another software and/or hardware component of the controller 414.

Figure 5:
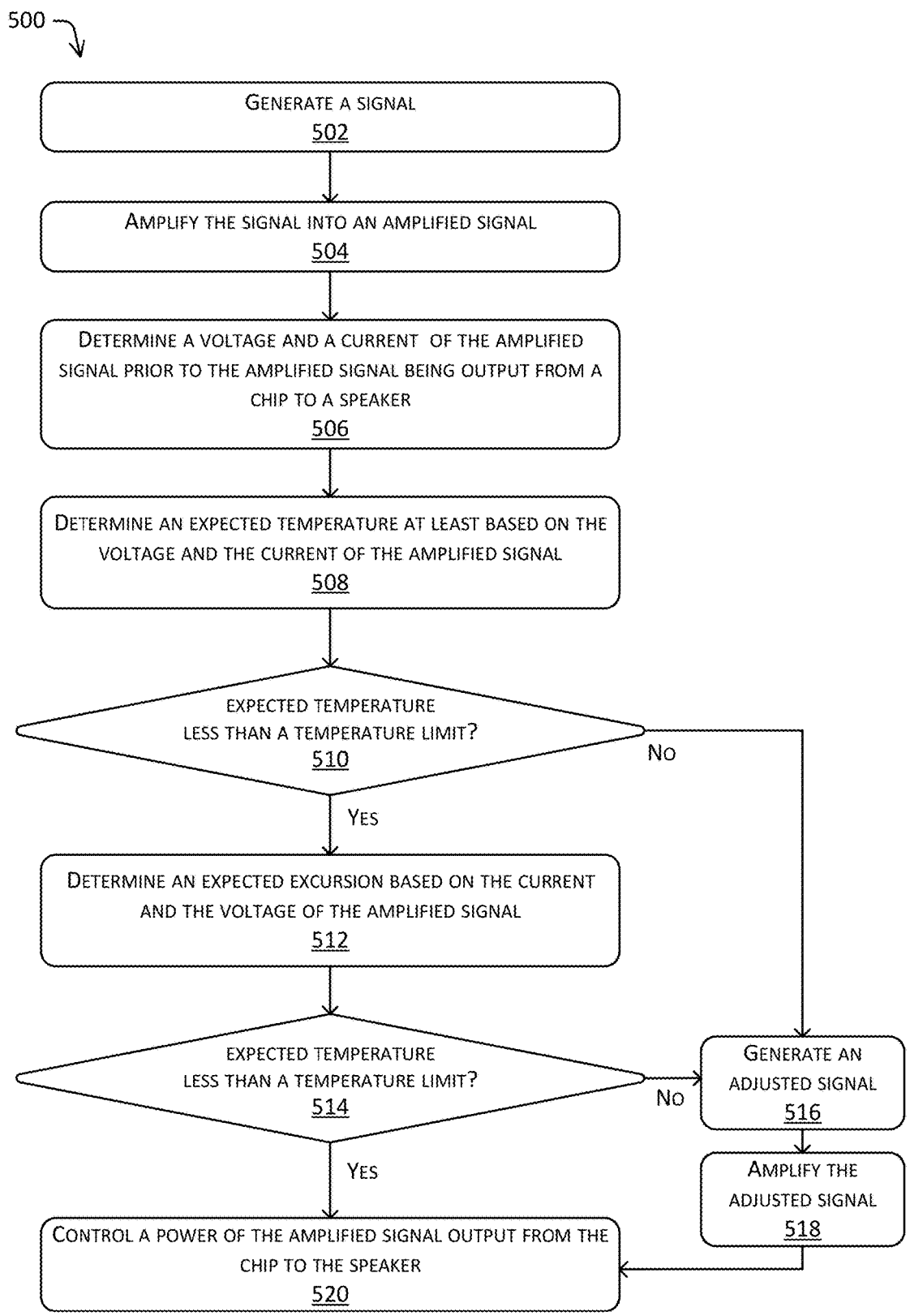
FIG. 5 is a flowchart of an example process for amplifying an audio source, in accordance with one or more examples.

FIG. 5 is a flowchart of an example process for amplifying an audio source, in accordance with one or more examples. Process 500 may be performed by components of an amplification system (e.g., amplification system 300B or amplification system 400). As described above, the audio system 400 may be a component of an electronic device (e.g., the headset 100 and/or the HMD 200) configured to amplify, by performing the process 500, an audio signal without damaging speakers by sensing the current and the voltage of the amplified signal prior to the amplified signal being output from a chip to the speakers. In some cases, the process 500 may include different and/or additional steps, or perform the steps in a different order than described herein.

In some examples, the process 500 includes an operation 502, in which the amplification system 400 generates a signal. For instance, the amplifier circuit 412 may receive an audio signal input (e.g., a digital audio signal) and perform signal processing on the audio signal input to generate an analog signal. In some cases, generate the analog signal may include applying one or more digital filters to increase the audio quality of the digital audio signal and converting the filtered digital audio signal into the analog signal.

An operation 504 includes the amplification system 400 amplifies the signal into an amplified signal. For instance, an amplifier on the amplifier circuit 412 can amplify the signal to obtain an amplified signal.

An operation 506 includes the amplification system 400 determines a voltage and a current of the amplified signal prior to the amplified signal being output from the amplifier circuit 412 to the speaker 416.

An operation 508 includes the amplification system 400 determines an expected temperature at least based on the current and the voltage of the amplified signal. For instance, the controller 414 can determine an expected resistance of the speaker voice coil of the speaker 416 using Ohm's law. The controller 414 can further determine an expected temperature of the speaker voice coil based on the expected resistance of the speaker voice coil of the speaker 416 and a temperature coefficient of resistance of the speaker voice coil of the speaker 416.

An operation 510 includes the amplification system 400 determines whether the expected temperature of the speaker voice coil of the speaker 416 is being less than a temperature limit of the speaker voice coil of the speaker 416. If the expected temperature of the speaker voice coil of the speaker 416 is being less than the temperature limit of the speaker voice coil of the speaker 416, operation 512 is executed. If the expected temperature of the speaker voice coil of the speaker 416 is being equal to or more than the temperature limit of the speaker voice coil of the speaker 416, operation 516 is executed.

An operation 512 includes the amplification system 400 determines an expected diaphragm excursion based on the current and the voltage of the amplified signal. For instance, the controller 414 can determine expected diaphragm excursion using a lookup table. In some examples, the lookup table may be generated by measuring the excursion of the speaker diaphragm using a laser displacement device and mapping the measured excursion to the voltage applied to the speaker terminals of speaker 416.

An operation 512 includes the amplification system 400 determines whether the expected diaphragm excursion is being less than an excursion limit of the speaker 416. If the expected diaphragm excursion is being less than the temperature limit of the excursion limit of the speaker 416, operation 520 is executed. If the expected diaphragm excursion is being equal to or more than the expected limit of the speaker 416, operation 516 is executed.

An operation 516 includes the amplification system 400 generates an adjusted signal. For instance, the controller 414 can generate the adjusted signal based on the expected temperature being equal to or greater than the temperature limit of the speaker 416 and/or the expected diaphragm excursion being equal to or greater than the excursion limit of the speaker 416.

An operation 518 includes the amplification system 400 amplifies the adjusted signal into an amplified-adjusted signal. For instance, an amplifier on the amplifier circuit 412 can amplify the adjusted signal to obtain the amplified-adjusted signal.

An operation 520 includes the amplification system 400 control the power from the amplifier circuit 412 to the speaker 416. For instance, the controller 414 can turn on the power from the amplifier circuit 412 to the speaker 416 based on the expected temperature being less than the temperature limit of the speaker 416 and the expected diaphragm excursion being less than the excursion limit of the speaker 416.

Figure 6:
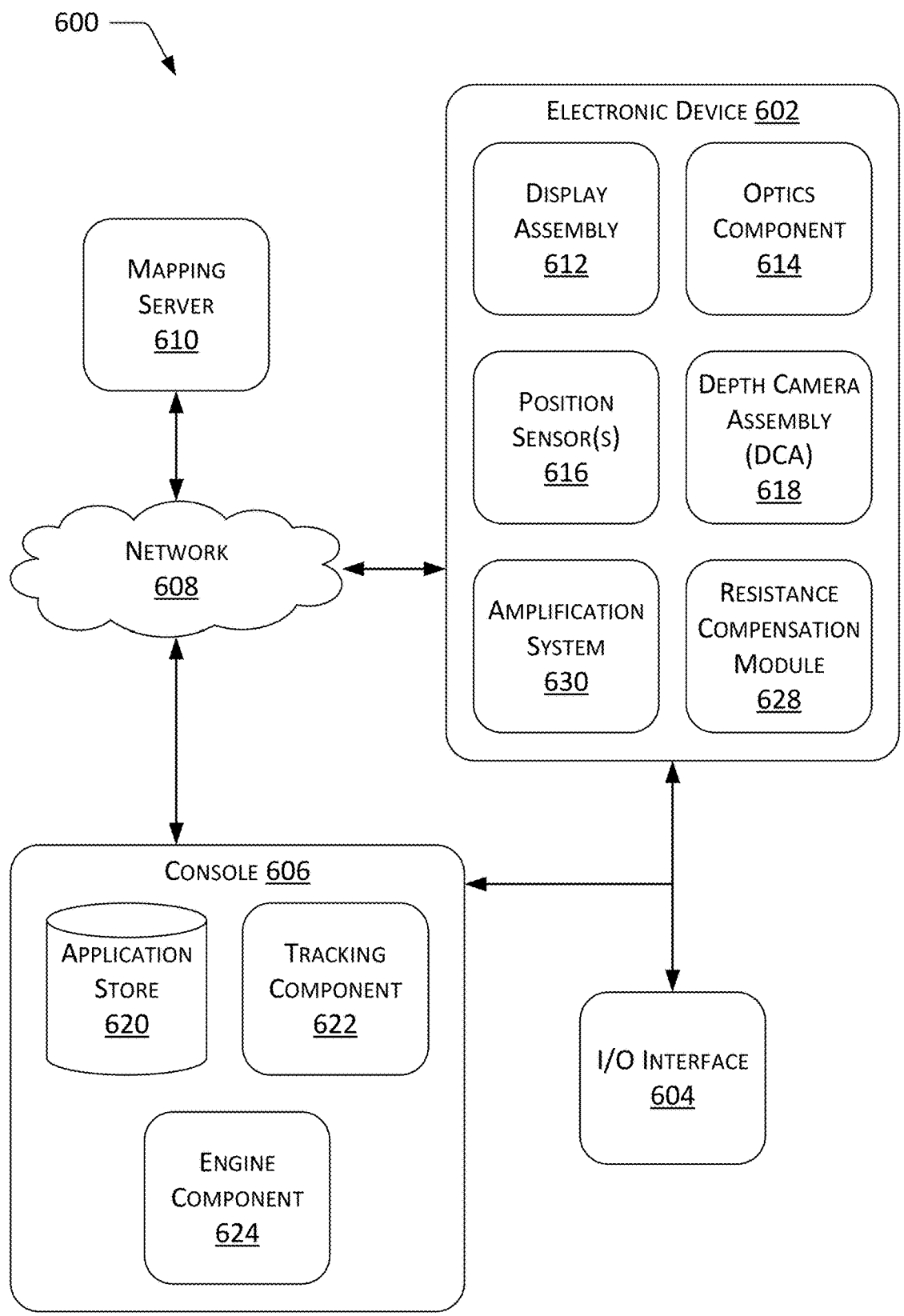
FIG. 6 is an example system for amplifying an audio source, in accordance with one or more examples.

FIG. 6 is an example system for amplifying an audio source, in accordance with one or more examples.

FIG. 6 is a block diagram of an example system environment 600 for localizing an audio source, in accordance with one or more examples. The example system environment 600 may comprise an artificial reality environment (e.g., a virtual reality environment, an augmented reality environment, a mixed reality environment, or some combination thereof). The example system environment 600 includes an electronic device 602, an input/output (I/O) interface 604 that is coupled to a console 606, a network 608, and a mapping server 610. In some examples, the electronic device 602 correspond to the headset 100 of FIG. 1, the HMD 200 of FIG. 2, one or more hearing aids, a mobile device, a tablet, a vehicle, or some other type of computing device that is configured to localize an audio signal according to the described techniques.

While FIG. 6 shows an example system environment 600 including one electronic device 602 and one I/O interface 604, examples are considered in which any number of these components may be included in the example system environment 600. For example, there may be multiple electronic devices each having an associated I/O interface 604, with each electronic device and I/O interface 604 communicating with the console 606. In some cases, different and/or additional components may be included in the example system environment 600. Functionality described in relation to one or more of the components shown in FIG. 6 may be distributed among the components in a different manner than described herein. For example, some or all of the functionality of the console 606 may be provided by the electronic device 602.

The electronic device 602 may include a display assembly 612, an optics component 614, one or more position sensors 616, and a depth camera assembly (DCA) 618. Some examples of the electronic device 602 have different components than those described in relation to FIG. 6. Additionally, the functionality provided by various components described in relation to FIG. 6 may be differently distributed among the components of the electronic device 602 in some examples, or be captured in separate assemblies remote from the electronic device 602.

In some examples, the display assembly 612 displays content to a user in accordance with data received from the console 606. The display assembly 612 may display the content using one or more display elements (e.g., the display elements 104). A display element may be, for instance, an electronic display. In some examples, the display assembly 612 may comprise a single display element or multiple display elements (e.g., a display for each eye of a user). Examples of an electronic display include, but are not limited to, a liquid crystal display (LCD), an organic light emitting diode (OLED) display, an active-matrix organic light-emitting diode display (AMOLED), a waveguide display, or some combination of these display types. In some examples, the display assembly 612 may also be configured to perform some or all of the functionality of the optics component 614.

The optics component 614 may magnify image light received from the display assembly 612, correct optical errors associated with the image light, and present the corrected image light to one or both eyeboxes of the electronic device 602. In some examples, the optics component 614 includes one or more optical elements such as an aperture, a Fresnel lens, a convex lens, a concave lens, a filter, a reflecting surface, or any other suitable optical element that can affect image light. In some cases, the optics component 614 may include combinations of different optical elements. In some examples, one or more of the optical elements in the optics component 614 may be coated by one or more coatings, such as partially reflective or anti-reflective coatings.

Magnification and focusing of the image light by the optics component 614 allows an electronic display of the display assembly 612 to be physically smaller, weigh less, and consume less power than larger displays. Additionally, magnification by the optics component 614 may increase the field of view of the content presented by the electronic display. For example, the electronic display may display content in the field of view such that the displayed content is presented using almost all (e.g., approximately 110 degrees diagonal), and in some cases, all of a user's field of view. Additionally, in some examples, an amount of magnification may be adjusted by adding or removing optical elements of the optics component 614.

In some embodiments, the optics component 614 may be designed to correct one or more types of optical error. Examples of optical error include, but are not limited to, barrel or pincushion distortion, longitudinal chromatic aberrations, transverse chromatic aberrations, spherical aberrations, chromatic aberrations, or errors due to the lens field curvature, astigmatisms, and so forth. In some examples, content provided to the electronic display for display to a user may be pre-distorted, and the optics component 614 may correct the distortion after receiving image light associated with the content.

The position sensor 616 may be configured to generate data indicating a position of the electronic device 602. In some examples, the position sensor 616 generates one or more measurement signals in response to motion of the electronic device 602. The position sensor(s) 616 may include one or more of an IMU, accelerometer, gyroscope, magnetometer, another suitable type of sensor that detects motion, or some combination thereof. In some cases, the position sensor 616 may include multiple accelerometers to measure translational motion (forward/back, up/down, left/right) and multiple gyroscopes to measure rotational motion (e.g., pitch, yaw, roll). In some examples, the position sensors 616 include an IMU that rapidly samples measurement signals and calculates an estimated position of the electronic device 602 from the sampled data. For example, the IMU may integrate the measurement signals received from the accelerometers over time to estimate a velocity vector and integrate the velocity vector over time to determine an estimated position of a reference point on the electronic device 602 that describes a position of the electronic device 602 in the environment. The reference point may be defined as a point in space and/or defined as a point within the electronic device 602.

In some examples, the DCA 618 generates depth information for an environment surrounding the electronic device 602. The DCA 618 may include one or more imaging devices, an illuminator, and a DCA controller (not shown). Operation and structure of the DCA 618 is described above with regard to FIG. 1.

Amplification system 630 may have a structure same as the structure of the amplification system 300B of FIG. 3B or the structure of the amplification system 400 of FIG. 4. The amplification system 630 may generate a signal; amplifying the signal into an amplified signal; determine a voltage of the amplified signal prior to the amplified signal being output from a chip to a speaker; determine a current of the amplified signal prior to the amplified signal being output from the chip to the speaker; and control a power of the amplified signal output from the chip to the speaker based at least on the current and the voltage.

In some examples, the speaker has a temperature limit, and the speaker has a temperature coefficient of resistance. The amplification system 630 may further determine an expected resistance based on the current and the voltage of the amplified signal; determine an expected temperature based on the expected resistance and the temperature coefficient of resistance; and control the power from the chip to the speaker based at least in part on the expected temperature being less than the temperature limit of the speaker. The amplification system 630 may also generate an adjusted signal based at least in part on the expected temperature being equal to or greater than the temperature limit of the speaker; amplify, by the amplifier, the adjusted signal to obtain an amplified-adjusted signal; and control the power from the chip to the speaker to output the amplified-adjusted signal from the chip to the speaker.

In some examples, the speaker has an excursion limit. The amplification system 630 may further determine an expected excursion based on the current and the voltage of the amplified signal; and control the power from the chip to the speaker is further based at least in part on the expected excursion being less than the excursion limit of the speaker. The amplification system 630 may also generate an adjusted signal based at least in part on the expected excursion being equal to or greater than the excursion limit of the speaker; amplify, by the amplifier, the adjusted signal to obtain an amplified-adjusted signal; and control the power from the chip to the speaker to output the amplified-adjusted signal to the speaker.

In some examples, the speaker is a first speaker, the amplified signal is a first amplified signal, the signal is amplified into the first amplified signal via a first amplifier element on the chip. The amplification system 630 (e.g., the amplification system 400 of FIG. 4) may further amplify the signal into a second amplified signal via a second amplifier element on the chip; and control a power of the second amplified signal output from the chip to the second speaker based at least on the current and the voltage.

In some examples, the electronic device 602 may include a resistance compensation module 628 configured to compensate for the resistance from a trace or a wire that connects the speaker and the amplification system 630. The resistance compensation module 628 may be implemented in software and/or hardware and may include a lookup table, function, algorithm, circuit, or other component to determine an actual current and/or voltage applied to the speaker based on the current and/or voltage output from the amplification system 630. In some examples, the resistance compensation module 628 may be built into the speaker protection algorithm or another software and/or hardware component of the amplification system 630.

The I/O interface 604 may be a device that allows a user to send action requests and receive responses from the console 606. In some examples, an action request may be an instruction to start or end capture of image or video data, or an instruction to perform a particular action within an application. The I/O interface 604 may include one or more input devices, such as a keyboard, a mouse, a game controller, or any other suitable device for receiving action requests and communicating the action requests to the console 606. In some examples, an action request received by the I/O interface 604 is communicated to the console 606, which performs an action corresponding to the action request. In some examples, the I/O interface 604 includes an IMU that captures calibration data indicating an estimated position of the I/O interface 604 relative to an initial position of the I/O interface 604. In some examples, the I/O interface 604 may provide haptic feedback to the user in accordance with instructions received from the console 606. For example, haptic feedback is provided when an action request is received, or the console 606 communicates instructions to the I/O interface 604 causing the I/O interface 604 to generate haptic feedback when the console 606 performs an action.

In some examples, the console 606 provides content to the electronic device 602 for processing in accordance with information received from one or more of the DCA 618, the electronic device 602, and/or the I/O interface 604. In the example shown in FIG. 6, the console 606 includes an application store 620, a tracking component 622, and an engine component 624. Some examples of the console 606 have additional and/or different components than those described in relation to FIG. 6. Additionally, the functions described below may be distributed among components of the console 606 in a different manner than described in relation to FIG. 6. In some examples, the functionality discussed herein with respect to the console 606 may be implemented in the electronic device 602, and/or a remote system.

The application store 620 may store one or more applications for execution by the console 606. An application is a group of instructions, that when executed by a processor, generates content for presentation to the user. Content generated by an application may be in response to inputs received from the user via movement of the electronic device 602 and/or the I/O interface 604. Examples of applications include, but are not limited to, gaming applications, conferencing applications, video playback applications, or other suitable applications.

In some examples, the tracking component 622 tracks movements of the electronic device 602 and/or of the I/O interface 604 using information from the DCA 618, the one or more position sensors 616, or some combination thereof. For example, the tracking component 622 determines a position of a reference point of the electronic device 602 in a mapping of a local area of an environment based on information from the electronic device 602. The tracking component 622 may also determine positions of an object or virtual object. Additionally, in some examples, the tracking component 622 may use data indicating a position of the electronic device 602 from the position sensor 616 as well as representations of the local area from the DCA 618 to predict a future location of the electronic device 602. The tracking component 622 may provide the estimated or predicted future position of the electronic device 602 and/or the I/O interface 604 to the engine component 624.

The engine component 624 may execute applications and receive position information, acceleration information, velocity information, predicted future positions, or some combination thereof, of the electronic device 602 from the tracking component 622. Based on the received information, the engine component 624 may determine content to provide to the electronic device 602 for presentation to the user. For example, if the received information indicates that the user has looked to the left, the engine component 624 may generate content for the electronic device 602 that mirrors the user's movement in a virtual local area or in a local area augmenting the local area with additional content. Additionally, the engine component 624 may perform an action within an application executing on the console 606 in response to an action request received from the I/O interface 604 and provide feedback to the user that the action was performed. The provided feedback may be visual or audible feedback via the electronic device 602, or haptic feedback via the I/O interface 604.

In some examples, the network 608 couples the electronic device, the console 606, and the mapping server 610. The network 608 may include any combination of local area and/or wide area networks using both wireless and/or wired communication systems. For example, the network 608 may include the Internet and/or mobile telephone networks. In some cases, the network 608 uses standard communications technologies and/or protocols. Hence, the network 608 may include links using technologies such as Ethernet, 802.11, worldwide interoperability for microwave access (WiMAX), 2G/3G/4G/5G mobile communications protocols, digital subscriber line (DSL), asynchronous transfer mode (ATM), InfiniBand, PCI Express Advanced Switching, and so forth. The networking protocols used on the network 608 may include multiprotocol label switching (MPLS), transmission control protocol/Internet protocol (TCP/IP), User Datagram Protocol (UDP), hypertext transport protocol (HTTP), simple mail transfer protocol (SMTP), file transfer protocol (FTP), and so on. The data exchanged over the network 608 may be represented using technologies and/or formats including image data in binary form (e.g., Portable Network Graphics (PNG)), hypertext markup language (HTML), extensible markup language (XML), and the like. In some examples, all or some information may be encrypted using encryption technologies such as secure sockets layer (SSL), transport layer security (TLS), virtual private networks (VPNs), Internet Protocol security (IPsec), and so on.

The mapping server 610 may include a database that stores a virtual model describing a plurality of spaces, where a location in the virtual model corresponds to a current configuration of a local area of the electronic device 602. The mapping server 610 may receive, from the electronic device 602 via the network 608, information describing at least a portion of the environment surrounding the electronic device 602 and/or location information for the environment surrounding the electronic device 602. A user may adjust privacy settings to allow or prevent the electronic device 602 from transmitting information to the mapping server 610. In some examples, the mapping server 610 determines, based on the received information and/or location information, a location in the virtual model that is associated with the local area of the environment where the electronic device 602 is located. The mapping server 610 may determine (e.g., retrieve) one or more acoustic parameters associated with the local area, based in part on the determined location in the virtual model and any acoustic parameters associated with the determined location. The mapping server 610 may transmit the location of the local area and values of acoustic parameters associated with the local area to the electronic device 602.

One or more components of the example system environment 600 may contain a privacy component that stores one or more privacy settings for user data elements. The user data elements describe the user and/or the electronic device 602. For example, the user data elements may describe a physical characteristic of the user, an action performed by the user, a location of the user of the electronic device 602, a location of the electronic device 602, an HRTF for the user, and so forth. Privacy settings (or "access settings") for a user data element may be stored in any suitable manner, such as, for example, in association with the user data element, in an index on an authorization server, in another suitable manner, or any suitable combination thereof.

A privacy setting for a user data element specifies how the user data element (or particular information associated with the user data element) can be accessed, stored, or otherwise used (e.g., viewed, shared, modified, copied, executed, surfaced, or identified). In some examples, the privacy settings for a user data element may specify a "blocked list" of entities that may not access certain information associated with the user data element. The privacy settings associated with the user data element may specify any suitable granularity of permitted access or denial of access. For example, some entities may have permission to see that a specific user data element exists, some entities may have permission to view the content of the specific user data element, and some entities may have permission to modify the specific user data element. The privacy settings may allow the user to allow other entities to access or store user data elements for a finite period of time.

The privacy settings may allow a user to specify one or more geographic locations from which user data elements can be accessed. Access or denial of access to the user data elements may depend on the geographic location of an entity who is attempting to access the user data elements. For example, the user may allow access to a user data element and specify that the user data element is accessible to an entity only while the user is in a particular location. If the user leaves the particular location, the user data element may no longer be accessible to the entity. As another example, the user may specify that a user data element is accessible only to entities within a threshold distance from the user, such as another user of a headset within the same local area as the user. If the user subsequently changes location, the entity with access to the user data element may lose access, while a new group of entities may gain access as they come within the threshold distance of the user.

The example system environment 600 may include one or more authorization/privacy servers for enforcing privacy settings. A request from an entity for a particular user data element may identify the entity associated with the request and the user data element may be sent only to the entity if the authorization server determines that the entity is authorized to access the user data element based on the privacy settings associated with the user data element. If the requesting entity is not authorized to access the user data element, the authorization server may prevent the requested user data element from being retrieved or may prevent the requested user data element from being sent to the entity. Although this disclosure describes enforcing privacy settings in a particular manner, this disclosure contemplates enforcing privacy settings in any suitable manner.

The foregoing description has been presented for illustration; it is not intended to be exhaustive or to limit the scope of the disclosure to the precise forms disclosed. Persons skilled in the relevant art can appreciate that many modifications and variations are possible considering the above disclosure.

Some portions of this description describe the examples in terms of algorithms and symbolic representations of operations on information. These algorithmic descriptions and representations may be used by those skilled in the data processing arts to convey the substance of their work effectively to others skilled in the art. These operations, while described functionally, computationally, or logically, are understood to be implemented by computer programs or equivalent electrical circuits, microcode, or the like. The described operations and their associated components may be embodied in software, firmware, hardware, or any combinations thereof.

Any of the steps, operations, or processes described herein may be performed or implemented with one or more hardware or software modules, alone or in combination with other devices. In some examples, a software module is implemented with a computer program product comprising a computer-readable medium containing computer program code, which can be executed by a computer processor for performing any or all the steps, operations, or processes described.

Examples may also relate to an apparatus for performing the operations herein. This apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Examples may also relate to a product that is produced by a computing process described herein. Such a product may comprise information resulting from a computing process, where the information is stored on a non-transitory, tangible computer readable storage medium and may include any embodiment of a computer program product or other data combination described herein.

Finally, the language used in the specification has been principally selected for readability and instructional purposes, and it may not have been selected to delineate or circumscribe the patent rights. It is therefore intended that the scope of the patent rights be limited not by this detailed description, but rather by any claims that issue on an application based hereon. Accordingly, the disclosure of the examples is intended to be illustrative, but not limiting, of the scope of the patent rights, which is set forth in the following claims.

What is claimed is:

1. An apparatus, comprising:
    a speaker; and
    a chip electrically coupled to the speaker by an electrical connection, wherein the chip comprises:
        a processor configured to generate a signal;
        an amplifier element on the chip, the amplifier element configured to amplify the signal into an amplified signal, wherein the amplifier element is located at least one of:
            in direct contact with terminals of the speaker; or
            a distance away from the terminals of the speaker, wherein a software resistance compensation module is used to compensate for resistance from a connection element that connects the amplifier element and the speaker;
        a current monitor on the chip, the current monitor configured to monitor a current of the amplified signal prior to the amplified signal being output from the chip to the speaker;
        a voltage monitor on the chip, the voltage monitor configured to monitor a voltage of the amplified signal prior to the amplified signal being output from the chip to the speaker; and
        wherein the processor of the chip is configured to control a power of the amplified signal output from the chip to the speaker based at least on the current and the voltage.

2. The apparatus of claim 1, wherein the speaker has a temperature limit, and wherein the speaker has a temperature coefficient of resistance, wherein the processor of the chip is configured to:
    determine an expected resistance based on the current and the voltage of the amplified signal;
    determine an expected temperature based on the expected resistance and the temperature coefficient of resistance; and
    control the power from the chip to the speaker based at least in part on the expected temperature being less than the temperature limit of the speaker.

3. The apparatus of claim 2, wherein the processor of the chip is further configured to:
    generate an adjusted signal at least in part on the expected temperature being equal to or greater than the temperature limit of the speaker;
    amplify, by the amplifier, the adjusted signal to obtain an amplified-adjusted signal; and
    control the power from the chip to the speaker to output the amplified-adjusted signal from the chip to the speaker.

4. The apparatus of claim 1, wherein the speaker has an excursion limit, and wherein the processor of the chip is configured to determine an expected excursion based on the current and the voltage of the amplified signal and control the power from the chip to the speaker based at least in part on the expected excursion being less than the excursion limit of the speaker.

5. The apparatus of claim 4, wherein the processor of the chip is further configured to:
generate an adjusted signal based at least in part on the expected excursion being equal to or greater than the excursion limit of the speaker;
amplify, by the amplifier, the adjusted signal to obtain an amplified-adjusted signal; and
control the power from the chip to the speaker to output the amplified-adjusted signal to the speaker.

6. The apparatus of claim 1, wherein the speaker is a first speaker,
wherein the apparatus further comprises a second speaker,
wherein the chip further comprises a second amplifier element configured to amplify the signal into a second amplified signal; and
wherein the processor of the chip is further configured to control a power of the second amplified signal output from the chip to the second speaker based at least on the current and the voltage.

7. The apparatus of claim 1, the apparatus comprises a head-mounted device.

8. A method for amplifying an audio source comprising:
generating a signal;
amplifying, by an amplifier element on a chip, the signal into an amplified signal, wherein the amplifier element is located at least one of:
in direct contact with terminals of a speaker; or
a distance away from the terminals of the speaker, wherein a software resistance compensation module is used to compensate for resistance from a connection element that connects the amplifier element and the speaker;
determining a voltage of the amplified signal prior to the amplified signal being output from the chip to the speaker;
determining a current of the amplified signal prior to the amplified signal being output from the chip to the speaker; and
controlling a power of the amplified signal output from the chip to the speaker based at least on the current and the voltage.

9. The method of claim 8, wherein the speaker has a temperature limit, and wherein the speaker has a temperature coefficient of resistance, and the method further comprises:
determining an expected resistance based on the current and the voltage of the amplified signal;
determining an expected temperature based on the expected resistance and the temperature coefficient of resistance; and
controlling the power from the chip to the speaker based at least in part on the expected temperature being less than the temperature limit of the speaker.

10. The method of claim 9, further comprises:
generating an adjusted signal based at least in part on the expected temperature being equal to or greater than the temperature limit of the speaker;
amplifying, by the amplifier element, the adjusted signal to obtain an amplified-adjusted signal; and
controlling the power from the chip to the speaker to output the amplified-adjusted signal from the chip to the speaker.

11. The method of claim 8, wherein the speaker has an excursion limit, and the method further comprises:
determining an expected excursion based on the current and the voltage of the amplified signal; and
controlling the power from the chip to the speaker is further based at least in part on the expected excursion being less than the excursion limit of the speaker.

12. The method of claim 11, further comprises:
generating an adjusted signal based at least in part on the expected excursion being equal to or greater than the excursion limit of the speaker;
amplifying, by the amplifier element, the adjusted signal to obtain an amplified-adjusted signal; and
controlling the power from the chip to the speaker to output the amplified-adjusted signal to the speaker.

13. The method of claim 8, wherein the speaker is a first speaker, wherein the amplified signal is a first amplified signal, wherein the amplifier element is a first amplifier element on the chip, wherein the method further comprises:
amplifying the signal into a second amplified signal via a second amplifier element on the chip; and
controlling a power of the second amplified signal output from the chip to the second speaker based at least on the current and the voltage.

14. One or more non-transitory computer-readable media storing instructions that, when executed by one or more processors, cause the one or more processors to perform operations comprising: generating a signal; amplifying, by an amplifier element on a chip, the signal into an amplified signal, wherein the amplifier element is located at least one of: in direct contact with terminals of a speaker; or a distance away from the terminals of the speaker, wherein a software resistance compensation module is used to compensate for resistance from a connection element that connects the amplifier element and the speaker; determining a voltage of the amplified signal prior to the amplified signal being output from the chip to the speaker; determining a current of the amplified signal prior to the amplified signal being output from the chip to the speaker; and controlling a power of the amplified signal output from the chip to the speaker based at least on the current and the voltage.

15. The one or more non-transitory computer-readable media of claim 14, wherein the speaker has a temperature limit, and wherein the speaker has a temperature coefficient of resistance, and the operations further comprising:
determining an expected resistance based on the current and the voltage of the amplified signal;
determining an expected temperature based on the expected resistance and the temperature coefficient of resistance; and
controlling a power of the amplified signal output from the chip to the speaker based at least in part on the expected temperature being less than a temperature limit of the speaker.

16. The one or more non-transitory computer-readable media of claim 15, the operations further comprising:
generating an adjusted signal based at least in part on the expected temperature being equal to or greater than the temperature limit of the speaker;
amplifying, by the amplifier element, the adjusted signal to obtain an amplified-adjusted signal; and
controlling the power from the chip to the speaker to output the amplified-adjusted signal from the chip to the speaker.

17. The one or more non-transitory computer-readable media of claim 14, wherein the speaker has an excursion limit, and the operations further comprising:
determining an expected excursion based on the current and the voltage of the amplified signal; and controlling the power from the chip to the speaker is further based at least in part on the expected excursion being less than the excursion limit of the speaker.

18. The one or more non-transitory computer-readable media of claim 17, the operations further comprising:
generating an adjusted signal based at least in part on the expected excursion being equal to or greater than the excursion limit of the speaker;
amplifying, by the amplifier element, the adjusted signal to obtain an amplified-adjusted signal; and
controlling the power from the chip to the speaker to output the amplified-adjusted signal to the speaker.

19. The one or more non-transitory computer-readable media of claim 14, wherein the speaker is a first speaker, wherein the amplified signal is a first amplified signal, wherein the amplifier element is a first amplifier element on the chip, the operations further comprising:
amplifying the signal into a second amplified signal via a second amplifier element on the chip; and
controlling a power of the second amplified signal output from the chip to the second speaker based at least on the current and the voltage.

20. The one or more non-transitory computer-readable media of claim 14, wherein the chip comprises a first pin coupled to the speaker and a second pin coupled to the speaker, and the chip is configured to control the power of the amplified signal output from the chip to the speaker based on determination of the current of the amplified signal and the voltage of the amplified signal obtained from the first and second pins.

* * * * *